United States Patent
Choe et al.

[11] Patent Number: 5,629,614
[45] Date of Patent: May 13, 1997

[54] VOLTAGE-TO-CURRENT CONVERTER

[75] Inventors: Myung-Jun Choe, Puchon; Byeong-Whee Yun, Puchon-si, both of Rep. of Korea

[73] Assignee: Samsung Electronics Co., Ltd., Suwon, Rep. of Korea

[21] Appl. No.: 584,210

[22] Filed: Jan. 4, 1996

[30] Foreign Application Priority Data

Apr. 24, 1995 [KR] Rep. of Korea .................. 95-9622

[51] Int. Cl.$^6$ ................................ G05F 3/16; G05F 3/20
[52] U.S. Cl. ............................................ 323/315; 323/316
[58] Field of Search ............................... 323/315, 316; 330/257

[56] References Cited

U.S. PATENT DOCUMENTS

| | | | |
|---|---|---|---|
| 5,014,020 | 5/1991 | Hayashi et al. | 330/257 |
| 5,434,499 | 7/1995 | Narikawa et al. | 323/315 |
| 5,519,310 | 5/1996 | Bartlett | 323/316 |
| 5,545,972 | 8/1996 | Kiehl | 323/315 |

*Primary Examiner*—Stuart N. Hecker
*Attorney, Agent, or Firm*—Cushman Darby & Cushman, IP Group of Pillsbury Madison & Sutro LLP

[57] ABSTRACT

A voltage-to-current converter makes it possible to control conversion of a voltage to a current by considering the size of a transistor irrespective of supply voltage, input voltage, and fabrication conditions. It includes an operational amplifier for receiving a constant-voltage source to a noninverting terminal, and amplifying the voltage; a converting circuit for converting the input voltage to current after receiving the output voltage from the operational amplifier as an input; a current mirror for receiving the output current from the converting circuit as an input, and enabling two transistors of the current mirror to flow the same current; an electric potential holding circuit for maintaining two electric potentials which are applied on respective drain terminals of the two transistors of the current mirror to be equal; and an output current mirror for constantly maintaining current flowing out from the current mirror, which biases the electric potential of a drain terminal of the second transistor used in the current mirror with a predetermined value, and flows a constant voltage to the constant-current source output terminal.

2 Claims, 5 Drawing Sheets

5,629,614

VOLTAGE-TO-CURRENT CONVERTER

BACKGROUND OF THE INVENTION

1. Field of Invention

This invention relates to a voltage-to-current converter which makes it possible to control conversion of a voltage to a current by means of the size of a transistor irrespective of a supply voltage, an input voltage, and fabrication conditions of a transistor.

2. Description of the Prior Art

FIG. 1 of the drawings hereof is a detailed circuit diagram of a circuit provided with a conventional voltage-to-current converter which is used as a constant-current source by providing a constant-voltage source to an input voltage terminal $V_{IN}$ of this circuit, the converter also being useful in various circuits, when an analog circuit is used for an integrated circuit.

As shown in FIG. 1, the conventional voltage-to-current converter comprises an operational amplifier 10 for receiving a constant-voltage source $V_{IN}$ to a noninverting terminal, and amplifying the voltage; and a constant-current source generating circuit 20 for receiving an output voltage of the operational amplifier 10 as an input, and converting the inputted voltage to a constant-current $I_{OUT}$.

The constant-current source generating circuit 20 includes a converting circuit 21 for receiving the output voltage of the operational amplifier 10 as an input, and converting the inputted voltage to a current; a current mirror 22 for receiving the output current of the converting circuit 21, and enabling the transistors M2 and M3 to pass current of similar value; and an output current mirror 23 for biasing the voltage of a drain terminal of the transistor M3 with a predetermined value, to constantly maintain the current flowing out from the current mirror 22.

The converting circuit 21 includes an n-channel transistor M1 of which drain terminal is connected with a drain terminal a of the transistor M2 of the current mirror 22, and of which gate and source terminals are respectively connected with an output terminal b and an inverting terminal (−) of the operational amplifier 10; and a resistor R1 for connecting a source terminal of the transistor M1 to a ground terminal $V_{SS}$.

The current mirror 22 includes p-channel transistors M2 and M3 for applying a supply voltage $V_{DD}$ to a common source terminal, having a common gate terminal, and connecting the common gate terminal to the drain terminal a of the transistor M2; and a p-channel transistor M4 for connecting the source terminal with a drain terminal c of the transistor M3, and connecting a gate terminal with a gate terminal b of the transistor M1 of the converting circuit 21.

The output current mirror 23 includes an n-channel transistor M5 having a drain terminal connected to the drain terminal of the transistor M4 of the current mirror 22, connecting between drain terminal and gate terminal, and connecting a source terminal to the ground terminal $V_{SS}$; and an n-channel transistor M6 for connecting a drain terminal to the output terminal $I_{OUT}$ of the constant-current source, connecting a gate terminal to the gate terminal of the transistor M5, and connecting a source terminal to the ground terminal $V_{SS}$.

A conversion equation to be achieved by the above-identified conventional voltage-to-current converter is as follows:

$$I_{OUT}=K\times(V_{IN}/R1) \qquad (1)$$

By the operational amplifier 10 of the conventional voltage-to-current converter shown in FIG. 1, the resistor R1 of the converting circuit 21 has the input voltage $V_{IN}$. By this voltage $V_{IN}$, the current value of the n-channel transistor M1 is $V_{IN}/R1$ which also flows to the p-channel transistor M2 of the current mirror 22.

An equation showing a drain current of a MOSFET is as follows:

$$i_D=K(V_{GS}-V_T)^2 (1+\lambda V_{DS}) \qquad (2)$$

Where, $i_D$ is the drain current of the MOSFET;
$V_{GS}$ is the gate-to-source voltage of the MOSFET;
$V_{DS}$ is the drain-to-source voltage of the MOSFET;
$V_T$ is the threshold voltage of the MOSFET;
K is a proportional constant related to the size of the MOSFET; and
λ is a proportional constant related to both the size of the MOSFET and to the electric potential of the substrate of the MOSFET, namely, channel length modulation factor.

In the constant-current source generating circuit 20, the current mirror 22 enables the transistors M2 and M3 to flow current of a similar value, respectively, by making common gate and source terminals. According to equation (2), the current mirror 22 determines the current of both transistor by means of the gate-to-source voltage $V_{GS}$ and the drain-to-source voltage $V_{DS}$.

Consequently, in order to maintain the same current for the two transistors, the same voltage should be maintained for the gate-to-source voltage $V_{GS}$ and the drain-to-source voltage $V_{DS}$. In addition, as shown in equation (2), the current ratio of the two transistors of the current mirror 22 is determined by the proportional constant K related to the size of the MOSFET.

In the transistor M2 of the current mirror 22, the gate terminal is connected to the drain terminal. Accordingly, the gate-to-source voltage $V_{GS}$ is identical with the drain-to-source terminal $V_{DS}$. Further, by constantly determining the gate-to-source voltage $V_{GS}$ with respect to the drain current $i_D$, the voltage applied to the terminal a of the the transistor M2 is determined by the drain current $i_D$ as a constant value.

Meanwhile, to maintain the constant current ratio of the transistors M2 and M3 in the current mirror 22, the voltage of the drain terminal a of the transistor M2 should be identical with that of the drain terminal c of the transistor M3.

For the above purpose, the transistor M4 of the current mirror 22 has a function of biasing the voltage of the drain terminal c of the transistor M3 by a constant value.

In addition, the gate terminal b of the transistors M1 and M4 of the constant-current source generating circuit 20 is biased for applying a gate-to-source voltage $V_{GS1}$ that is suitable for flowing of the drain current $i_D$ by the transistor M1. Accordingly, the gate terminals of the transistors M1 and M4 have a voltage determined by adding the input voltage $V_{IN}$ to the gate-to-source voltage $V_{GS1}$.

The voltage applied to the drain terminal c of the transistor M3 of the current mirror 22 is added to the gate-to-source voltage $|V_{GS4}|$ of the transistor M4 in the terminal b of the transistors M1 and M4. The voltage is described in the following equation (3):

$$V(c)=V_{IN}+V_{GS1}+|V_{GS4}| \qquad (3)$$

Where, V(c) is an electric potential of node c.

At this time, the gate-to-source voltage $V_{GS1}$ of the transistor M1 is larger than the threshold voltage $V_{T1}$ of the transistor M1, and the gate-to-source voltage $|V_{GS4}|$ of the transistor M4 is larger than the threshold voltage $V_{T4}$ of the transistor M4.

Through the operation of the above-described conventional voltage-to-current converter, as shown in equation (3), since the node c has a varied voltage according to the input voltage $V_{IN}$, the transistors M2 and M3 of the current mirror 22 do not maintain the same current continuously. Accordingly, in case the input voltage $V_{IN}$ is varied, the conventional voltage-to-current converter has a problem, generating an error in the conversion equation (1).

FIG. 2 is the resulting graph of a simulation showing the variation of the output current $I_{OUT}$ in accordance with the input voltage $V_{IN}$ of the conventional voltage-to-current converter of FIG. 1.

As shown in FIG. 2, the actual result of the computer simulation has some errors, contrary to variation characteristics of the ideal output voltage $V_{OUT}$ with respect to the variation of the input voltage $V_{IN}$ calculated through the conversion equation in equation (1).

Also, as is widely known, in case the conventional voltage-to-current converter is embodied as an integrated circuit, the threshold voltage $V_T$ of the MOSFET may show a deviation according to the type of chip. In this case, the electric potential of the node c described in the equation (3) may sensitively vary according to both the fabrication method of the chip and the supply voltage $V_{DD}$.

FIG. 3 is the resulting graph of a simulation showing the variation of the output current $I_{OUT}$ in accordance with both the supply voltage $V_{DD}$ and the threshold voltage $V_T$ of the conventional voltage-to-current converter.

In the simulation graph shown in FIG. 3, the X-axis shows the supply voltage $V_{DD}$, each line plotted on the graph shows an actual result when the threshold voltage $V_T$ is varied by a small increment.

Since the input voltage $V_{IN}$ is 1.2 V and the resistor R1 is 600 KΩ, the ideal output current $I_{OUT}$ calculated through the conversion equation (1) is 200 μA. However, the actual simulation result has a number of errors compared with the above ideal current $I_{OUT}$.

SUMMARY OF THE INVENTION

An object of the invention is to provide a voltage-to-current converter which makes it possible to control the conversion of a voltage to a current by considering the size of a transistor irrespective of supply voltage, input voltage, and fabrication conditions of a transistor.

In order to achieve this object, the present invention includes an amplifier for amplifying the input voltage after receiving a constant-voltage source to a noninverting terminal as an input; and a constant-current source generator for receiving the output voltage from the amplifier, converting the input voltage to constant-current without error, irrespective of the supply voltage and fabrication conditions.

The constant-current source generator includes a converter for converting the input voltage to current after receiving the output voltage from the amplifier; a current mirror for receiving the output current from the converter as an input, and enabling the transistors M2 and M3 to flow current of similar value; an electric potential holding means for maintaining an equal value for two electric potentials which are applied on each drain terminal of two transistors composing the current mirror; and an output current mirror for constantly maintaining current flowing out from the current mirror, which biases the voltage of a drain terminal of any transistor used in the current mirror by means of a predetermined value, and flows the constant voltage to the constant-current source output terminal $I_{OUT}$.

DETAILED DESCRIPTION OF THE PREFERRED EMBODIMENT

A preferred embodiment of the present invention will become apparent from a study of the following detailed description, when viewed in light of the accompanying drawings.

Figure 1:
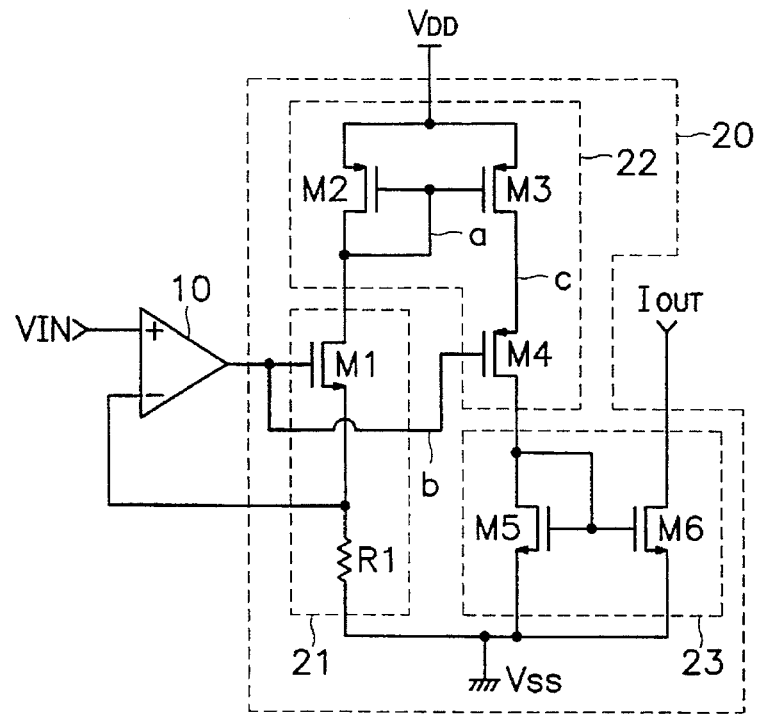
FIG. 1 is a detailed circuit diagram of a conventional voltage-to-current converter.
Figure 4:
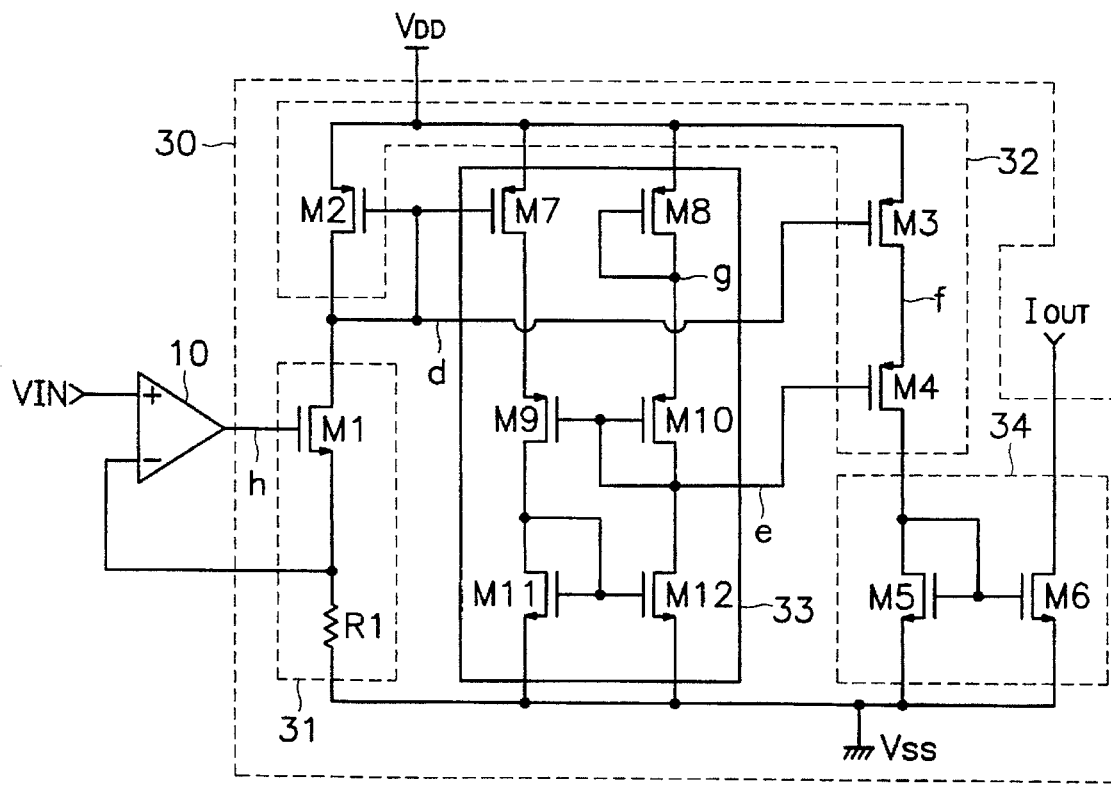
FIG. 4 is a detailed circuit diagram of a voltage-to-current converter in accordance with a preferred embodiment of the present invention.
Figure 2:
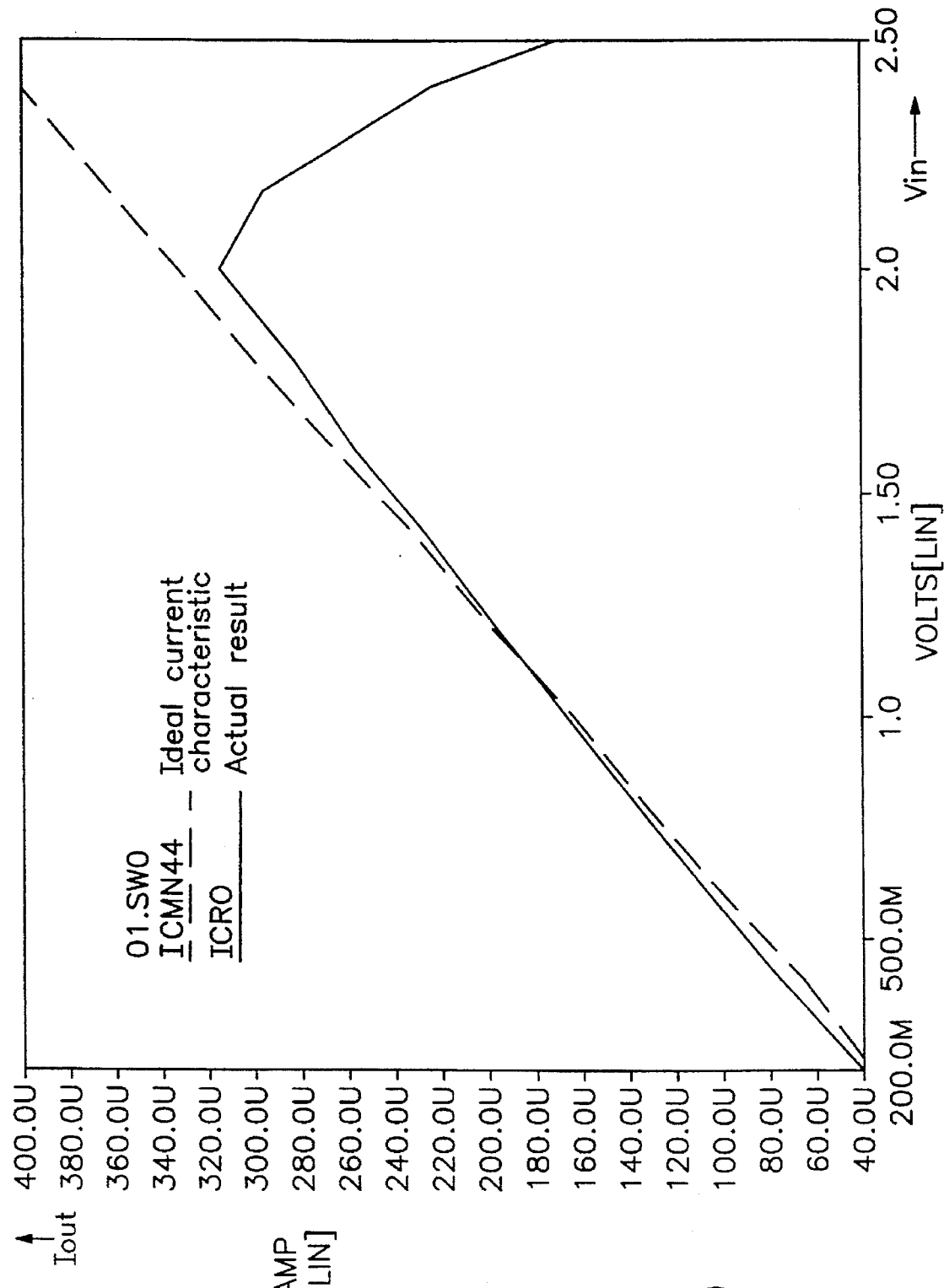
FIG. 2 is a resulting graph of a simulation showing the variation of the output current $I_{OUT}$ in accordance with the input voltage $V_{IN}$ of the conventional voltage-to-current converter.
Figure 3:
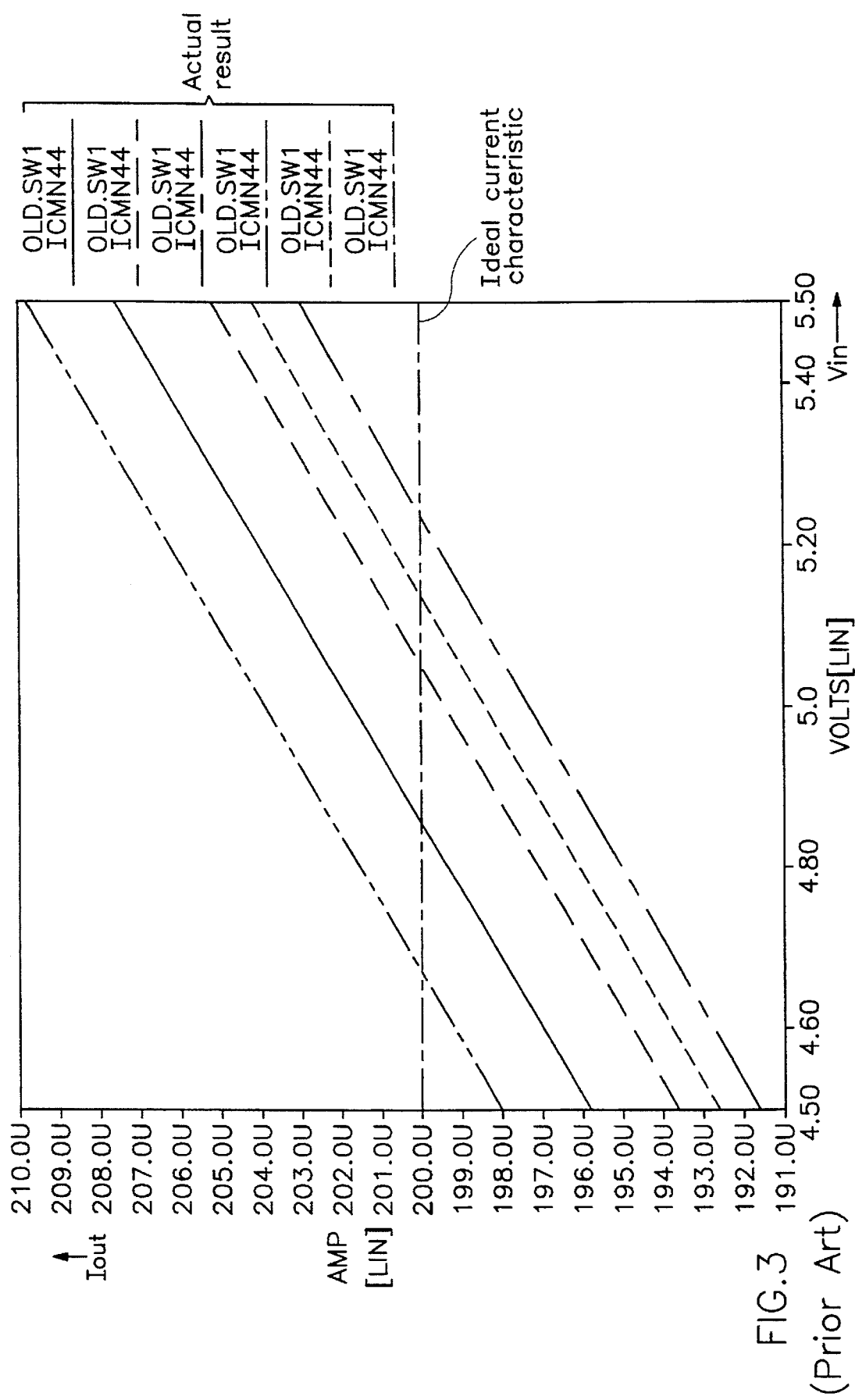
FIG. 3 is a resulting graph of a simulation showing the variation of the output current $I_{OUT}$ in accordance with both the supply voltage $V_{DD}$ and the threshold voltage $V_T$ of the conventional voltage-to-current converter.

As shown in FIG. 4, the voltage-to-current converter according to a preferred embodiment of the present invention comprises an operational amplifier 10 for receiving a constant-voltage source $V_{IN}$ to a noninverting terminal, and amplifying the voltage; and a constant-current source generating circuit 30 for receiving the output voltage from the operational amplifier 10, and converting the input voltage to constant-current, without error, irrespective of the supply voltage and fabrication conditions that were used for fabricating a transistor.

The constant-current source generating circuit 30 includes a converting circuit 31 for converting the input voltage to current after receiving the output voltage from the operational amplifier 10 as an input; a current mirror 32 for receiving the output current from the converting circuit 31 as an input, and enabling the transistors M2 and M3 to flow the same current; an electric potential holding circuit 33 for maintaining an equal value for two electric potentials which are applied on the respective drain terminals of the two transistors M2 and M3 composing the current mirror 32; and an output current mirror 34 for constantly maintaining the current flowing out from the current mirror 32, which biases the electric potential of the drain terminal of the transistor M3 used in the current mirror 32 by a predetermined value, and flows the constant voltage to the constant-current source output terminal $I_{OUT}$.

The converting circuit 31 includes an n-channel transistor M1, of which the drain terminal is connected with the drain terminal d of the transistor M2 of the current mirror 32, and of which the gate and source terminals are respectively connected with an output terminal h and an inverting terminal (−) of the operational amplifier 10; and a resistor R1 for connecting the source terminal of the transistor M1 to a ground terminal $V_{SS}$.

The current mirror 32 includes p-channel transistors M2 and M3 for applying a supply voltage $V_{DD}$ to a common source terminal, having a common gate terminal, and connecting the common gate terminal to the drain terminal d of the transistor M2; and a p-channel transistor M4 for connecting a source terminal of M4 to a drain terminal f of the transistor M3, and connecting a gate terminal of M4 to a drain terminal e of the transistor M10 of the electric potential holding circuit 33.

The electric potential holding circuit 33 includes p-channel transistors M7 and M8 for receiving the supply voltage $V_{DD}$ through a common source terminal; p-channel transistors M9 and M10 for connecting each source terminal with each drain terminal of the transistors M7 and M8, and having a common gate terminal; and n-channel transistors M11 and M12 for connecting each drain terminal of M11 and M12 to each drain terminal of the transistors M9 and M10, having a common gate terminal, and connecting each source terminal of M11 and M12 to a ground terminal $V_{SS}$.

The gate terminal of the transistor M7 is connected to the gate terminal d of the transistor M2 of the current mirror 32. Each gate terminal of transistors M8,M10, and M11 is connected to each respective drain terminal of M8,M10, and M11.

The output current mirror 34 includes an n-channel transistor M5 for connecting a drain terminal of M5 to the drain terminal of the transistor M4 of the electric potential holding circuit 33, connecting the drain terminal of M5 to a gate terminal, and connecting a source terminal of M5 to the ground terminal $V_{SS}$; and an n-channel transistor M6 for connecting a drain terminal of M6 to the output terminal $I_{OUT}$ of the constant-current source, connecting a gate terminal of M6 to the gate terminal of the transistor M5, and connecting a source terminal of M6 to the ground terminal $V_{SS}$.

The voltage-to-current converter in accordance with a preferred embodiment of the present invention adds an electric potential holding circuit 33 to a conventional voltage-to-current converter. The electric potential holding circuit 33 performs a function that maintains both the electric potential of the drain terminal f of the transistor M3 and that of the drain terminal d of the transistor M2 to be equal in the transistors M2 and M3 of the current mirror. Accordingly, the current of the transistor M3 of the voltage-to-current converter is not affected by the threshold voltage $V_T$, input voltage $V_{IN}$, and supply voltage $V_{DD}$.

Since the output terminal h of the operational amplifier 10 is connected to the gate terminal of the transistor M1 and the inverting input terminal (−) of the operational amplifier 10 is connected to the source terminal, the input voltage $V_{IN}$ of the operational amplifier 10 is applied to the resistor R1 connecting the source terminal of the transistor M1 to the ground terminal $V_{SS}$, thus enabling current corresponding to $V_{IN}/R1$ to flow.

Consequently, the current flowing in the resistor R1 becomes flow to the transistor M2 of the current mirror 32 through the transistor M1, the gate terminal d of the transistor M2 is connected to the drain terminal of M2, and the gate terminal is biased to an electric potential that makes it possible to flow the current of $V_{IN}/R1$.

Next, a current which is identical with that flowing the transistor M2 of the current mirror 32, or has a constant ratio K1, flows in the transistors M7, M9, and M11. The transistor M7 of the electric potential holding circuit 33 is connected to the transistor M2 of the current mirror 32 by using the common gate and source terminals, and is of the current mirror type. The transistor M9 connects a source terminal of M9 to the drain terminal of the transistor M7. The transistor M11 connects its own gate and source terminals to the drain terminal of the transistor M9, and connects a source terminal to the ground terminal $V_{SS}$. The ratio K1 is determined by the size ratio of the transistors M2 and M7.

That is, in case the transistors M2 and M7 have the same size, their currents also have the same value, in case the transistor M7 is half the size of the transistor M2, the transistor M7 flows half the current as compared with the transistor M2. Similarly, a current which is identical with that flowing the transistor M11, or has a constant ratio K2, flows in the transistors M12, M10, and M8. The transistor M12 is connected to the transistor M11 of the circuit for holding an electric potential 33 by using the common gate and source terminals, and is of the current mirror type. The transistor M10 connects its own drain and gate terminals with the drain terminal of the transistor M12. The transistor M8 connects its own drain and gate terminals with the source terminal of the transistor M10, and connects its own source terminal to the supply voltage $V_{DD}$. The ratio K2 is determined by the size ratio of the transistors M11 and M12.

The size ratio of the transistors M11 and M12 should also be maintained in the pairs of transistors M7 and M8, M9 and M10. That is, the size ratio of the transistors M9 and M10 should be identical with that of the pairs of transistors M7 and M9, M11 and M12.

An electric potential similar to that of the gate terminal d of the transistor M2 is biased to the gate terminal g of the transistor M8. An electric potential corresponding to a value obtained by subtracting the gate-to-source voltage $V_{GS10}$ from the above-described electric potential, is applied to the gate terminal e of the transistor M10.

Meanwhile, the current mirror 32 causes both the electric potential applied to the drain terminal f of the transistor M3 and the electric potential applied to the drain terminal d of the transistor M2, to have same value. Accordingly, a current having a constant ratio is maintained in the transistors M2 and M3.

As described above, the electric potential applied to the drain terminal g of the transistor M8 is identical with that of the drain terminal d of the transistor M10. The gate terminal e of the transistor M10 applies the electric potential corresponding to value obtained by subtracting the electric potential $|V_{GS10}|$ of the source-to-gate terminal of the transistor M10 from the electric potential of the drain terminal g of the transistor M8. Accordingly, the transistor M4, of which the gate terminal is connected to the gate terminal e of the transistor M10, and of which the source terminal f of the transistor M3 is connected to the drain terminal f of the transistor M3, applies an electric potential corresponding to a value obtained by subtracting the electric potential $|V_{GS4}|$ of the source-to-gate terminal of the transistor M4 from the gate terminal e of the transistor M10, through the source terminal f. As a result, the electric potential applied to the drain terminal f of the transistor M3 is identical with that of the drain terminal d of the transistor M2, and the transistor M3 maintains a current having a constant ratio as compared with the transistor M2.

Expressions related to the above description are described below.

$$I(M2)=I(M2)=V_{IN}/R1 \quad (4)$$

$$I(M7)=I(M9)=I(M11)=K_{M7}/K_{M2}\times I(M2) \quad (5)$$

$$I(M8)=I(M10)=I(M13)=K_{M12}/K_{M11}\times I(M11) \quad (6)$$

The current of the transistor M2 and the current of the transistor M8 are maintained as a constant ratio, and each of the transistors M2 and M8 has a diode connection. Accordingly, the following equations are achieved by the above expressions (5) and (6).

$$V_{GSM2} = V_{GSM8} \quad (7)$$

$$V(g) = V(d) \quad (8)$$

Thus, the following expressions are achieved.

$$V(e) = V(g) - |V_{GSM10}| \quad (9)$$

$$\begin{aligned} V(f) &= V(e) + |V_{GSM4}| \\ &= V(g) - |V_{GSM10}| + |V_{GSM4}| \\ &= V(d) - |V_{GSM10}| + |V_{GSM4}| \end{aligned} \quad (10)$$

$$\begin{aligned} \ldots I(M3) &= (K_{M3}/K_{M2}) \times I(M2) \\ &= (K_{M3}/K_{M2}) \times (V_{IN}/R1) = K \times V_{IN} \end{aligned} \quad (11)$$

In the above expression (10), since the gate-to-source voltage $V_{GSM10}$ of the transistor 10 is identical with the gate-to-source voltage $V_{GSM4}$ of the transistor M4, the electric potential of the node f is to be identical with that of the node d. Thus, the current ratio with respect to the transistor M2 and M3 is determined by the size of the transistor.

Figure 5:
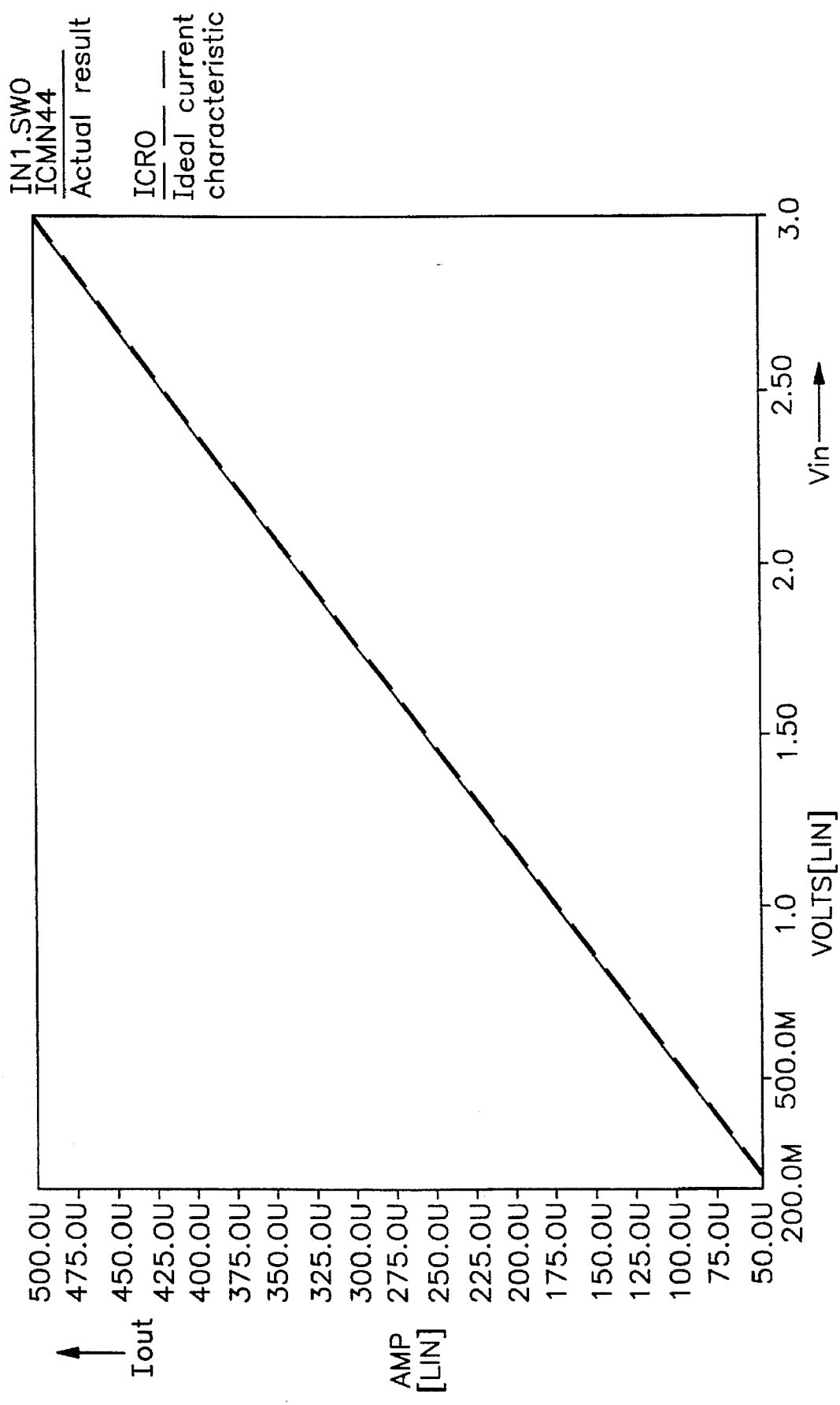
FIG. 5 is a resulting graph of a simulation showing the variation of the output current $I_{OUT}$ in accordance with the input voltage $V_{IN}$ of the preferred embodiment of the present invention.
Figure 6:
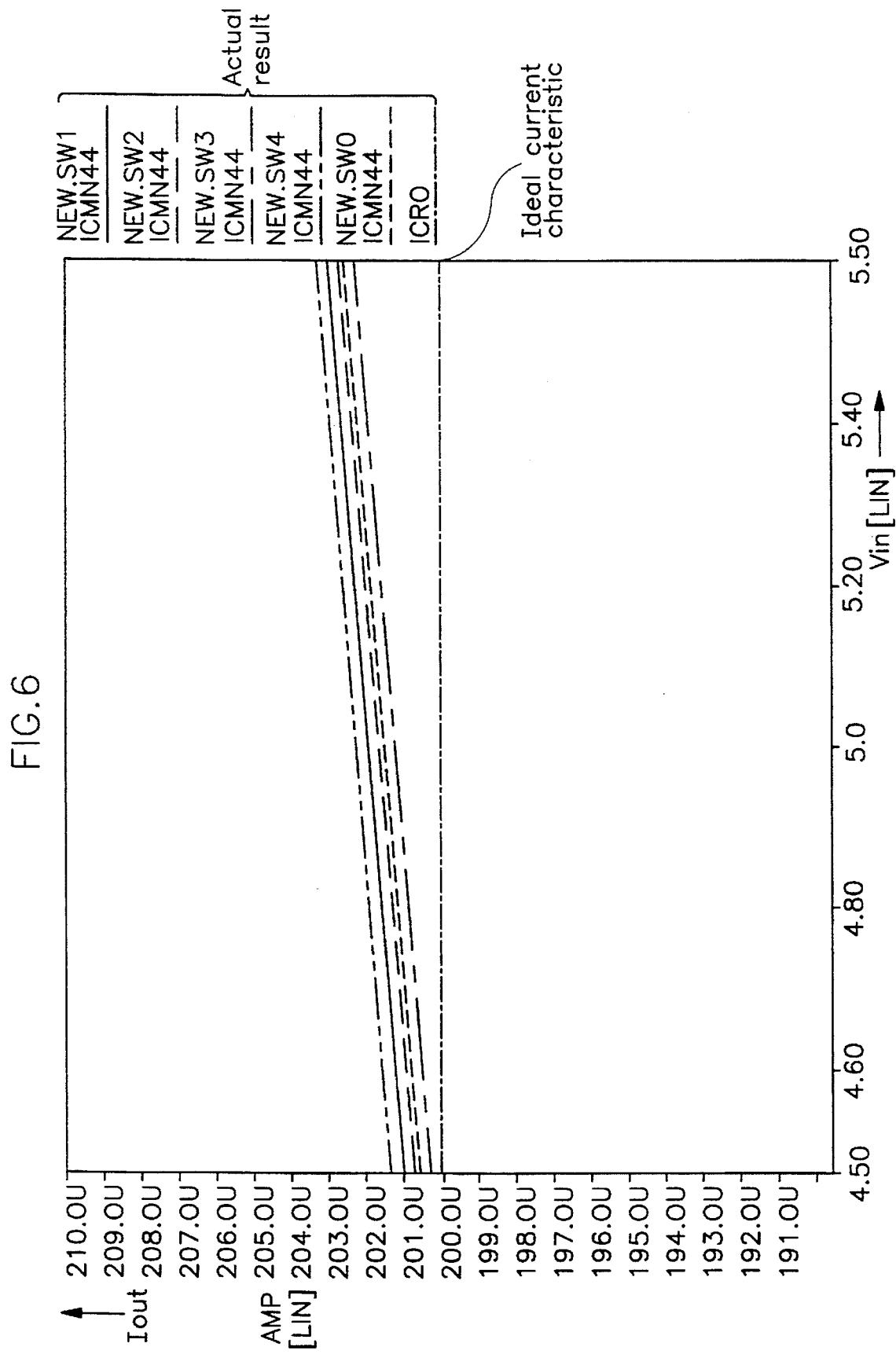
FIG. 6 is a resulting graph of a simulation showing the variation of the output current $I_{OUT}$ in accordance with both the supply voltage $V_{DD}$ and the threshold voltage $V_T$ of the preferred embodiment of the present invention.

As shown in FIGS. 5 and 6, as to the voltage-to-current converter in accordance with the preferred embodiment of the invention, the current variation according to the input voltage $V_{IN}$ is similar to the ideal current variation calculated by the conversion equation (1). Furthermore, FIGS. 5 and 6 show a current variation having no error with respect to the supply voltage $V_{DD}$ and the threshold voltage $V_T$.

Accordingly, the voltage-to-current converter according to a preferred embodiment of the present invention makes it possible to control conversion of a voltage to a current by considering the size of a transistor irrespective of supply voltage, input voltage, and fabrication conditions of a transistor.

What is claimed is:

1. A voltage-to-current converter, comprising:

an amplifying means for amplifying an input voltage after receiving a constant voltage from a constant-voltage source to a noninverting terminal of said amplifying means as an input, thereby providing an amplified voltage as an output voltage;

a converting means for converting voltage input thereto to current after receiving said output voltage from said amplifying means, thereby providing an output current;

a current mirror for receiving said output current from said converting means as an input, and enabling two transistors of said current mirror to flow current of a similar value relative to one another;

an electric potential holding means for maintaining two electric potentials which are applied on respective drain terminals of said two transistors to be equal; and an output current mirror for constantly maintaining current flowing out from said current mirror, which biases the electric potential of said drain terminal of a first transistor between said two transistors used in said current mirror by a predetermined value, and flows a constant voltage to a constant-current source output terminal of said output current mirror.

2. The voltage-to-current converter as defined in claim 1, wherein said electric potential holding means comprises:

a first transistor for receiving a supply voltage through a source terminal of said first transistor, and connecting a common gate terminal of said first transistor to a second transistor said two transistors of said current mirror;

a second transistor for connecting a source terminal of said second transistor with a drain terminal of said first transistor;

a third transistor for connecting both a drain terminal and a gate terminal of said third transistor to a drain terminal of said second transistor, and connecting a source terminal of said third transistor to a ground terminal;

a fourth transistor for connecting a source terminal of said fourth transistor to a source terminal of said first transistor;

a fifth transistor for connecting a source terminal of said fifth transistor to the gate and drain terminals of said fourth transistor, and connecting said gate and drain terminals of said fifth transistor to a gate terminal of said second transistor; and a sixth transistor for connecting a drain terminal of said sixth transistor with a drain terminal of said fifth transistor, connecting gate terminal of said sixth transistor with a gate terminal of said third transistor, and connecting a source terminal of said sixth transistor to a ground terminal.

* * * * *